(12) United States Patent
Klein et al.

(10) Patent No.: US 9,756,730 B2
(45) Date of Patent: Sep. 5, 2017

(54) CHIP-INTEGRATED THROUGH-PLATING OF MULTI-LAYER SUBSTRATES

(75) Inventors: Andreas Steffen Klein, Freigericht (DE); Eckhard Ditzel, Linsengericht (DE); Frank Krüger, Nidderau (DE); Michael Schumann, Neu-Ulm (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 3 days.

(21) Appl. No.: 13/883,154

(22) PCT Filed: Oct. 21, 2011

(86) PCT No.: PCT/EP2011/005304
§ 371 (c)(1),
(2), (4) Date: May 2, 2013

(87) PCT Pub. No.: WO2012/059186
PCT Pub. Date: May 10, 2012

(65) Prior Publication Data
US 2013/0223032 A1 Aug. 29, 2013

(30) Foreign Application Priority Data
Nov. 5, 2010 (DE) .................. 10 2010 050 343

(51) Int. Cl.
*H05K 1/18* (2006.01)
*H01L 23/13* (2006.01)
(Continued)

(52) U.S. Cl.
CPC ............ *H05K 1/183* (2013.01); *H01L 23/13* (2013.01); *H01L 23/36* (2013.01); *H01L 24/32* (2013.01);
(Continued)

(58) Field of Classification Search
CPC . H01L 2224/48091; H01L 2224/48465; H01L 2924/00; H01L 2224/48227;
(Continued)

(56) References Cited

U.S. PATENT DOCUMENTS 4,052,787 A * 10/1977 Shaheen et al. ................ 29/827
4,593,485 A 6/1986 Thillays
(Continued)

FOREIGN PATENT DOCUMENTS

| DE | 19701163 A1 * | 7/1998 | ....... G06K 19/07743 |
| DE | 19852832 A1 | 5/2000 | |
| DE | 10205521 A1 * | 8/2003 | ........... H05K 3/4084 |

OTHER PUBLICATIONS

Int'l Search Report issued Jan. 30, 2012 in Int'l Application No. PCT/EP2011/005304.
(Continued)

*Primary Examiner* — Yuriy Semenenko
(74) *Attorney, Agent, or Firm* — Panitch Schwarze Bellsario & Nadel LLP

(57) ABSTRACT

A laminate and method for producing the laminate are provided for contacting at least one electronic component. An insulating layer is laminated between first and second metal layers electrically contacted to each other in at least one contact region. At least one recess in the contact region is generated with at least one embossing and/or bulging in the first metal layer. The distance between the two metal layers is reduced, such that dimensions of the embossing/bulging are sufficient for taking up the electronic component, which is inserted and connected into the embossing/bulging in a conductive manner therein. The electronic component is taken up in the embossing/bulging entirely with respect to its circumference and at least partly with respect to the height (H) of the electronic component. The
(Continued)

laminate may be used as a circuit board, sensor, LED lamp, mobile phone component, control, or regulator.

10 Claims, 2 Drawing Sheets

(51) Int. Cl.
| | | |
|---|---|---|
| *H01L 23/36* | (2006.01) | |
| *H01L 33/60* | (2010.01) | |
| *H01L 23/00* | (2006.01) | |
| *H05K 3/00* | (2006.01) | |
| *H01L 33/48* | (2010.01) | |
| *H05K 3/40* | (2006.01) | |

(52) U.S. Cl.
CPC ............... *H01L 33/60* (2013.01); *H05K 3/00* (2013.01); *H01L 33/486* (2013.01); *H01L 2224/29339* (2013.01); *H01L 2224/48091* (2013.01); *H01L 2224/48227* (2013.01); *H01L 2224/48465* (2013.01); *H01L 2224/73265* (2013.01); *H01L 2224/8384* (2013.01); *H01L 2224/83385* (2013.01); *H01L 2924/12042* (2013.01); *H01L 2924/14* (2013.01); *H05K 3/4084* (2013.01); *H05K 2201/0355* (2013.01); *H05K 2201/10106* (2013.01); *H05K 2201/2054* (2013.01); *H05K 2203/0278* (2013.01); *H05K 2203/049* (2013.01); *H05K 2203/063* (2013.01); *H05K 2203/1484* (2013.01); *Y10T 29/49002* (2015.01)

(58) Field of Classification Search
CPC . H01L 2924/00014; H01L 2224/29339; H01L 2224/73265; H01L 2224/83385; H01L 2224/8384; H01L 23/13; H01L 23/36; H01L 24/32
USPC .......... 361/760, 761, 806–809; 174/250–261
See application file for complete search history.

(56) References Cited

U.S. PATENT DOCUMENTS

| | | | | |
|---|---|---|---|---|
| 5,833,783 | A | * | 11/1998 | Choi et al. ....................... 156/64 |
| 6,007,668 | A | * | 12/1999 | Kodani et al. ................ 156/295 |
| 2002/0163006 | A1 | * | 11/2002 | Yoganandan et al. .......... 257/81 |
| 2009/0014732 | A1 | | 1/2009 | Nishida et al. |
| 2009/0014749 | A1 | | 1/2009 | Matsuda |
| 2009/0039377 | A1 | | 2/2009 | Horio et al. |
| 2009/0321527 | A1 | * | 12/2009 | Kato et al. ..................... 235/486 |
| 2011/0260600 | A1 | * | 10/2011 | Ibi et al. ....................... 313/113 |
| 2013/0213697 | A1 | * | 8/2013 | Palaniswamy et al. ...... 174/254 |
| 2013/0215584 | A1 | * | 8/2013 | Klein et al. ................... 361/760 |

OTHER PUBLICATIONS

Office Action issued Jan. 31, 2014 in DE Application No. 10 2010 050 343.6.

\* cited by examiner

CHIP-INTEGRATED THROUGH-PLATING OF MULTI-LAYER SUBSTRATES

CROSS-REFERENCE TO RELATED APPLICATIONS

This application is a Section 371 of International Application No. PCT/EP2011/005304, filed Oct. 21, 2011, which was published in the German language on May 10, 2012, under International Publication No. WO 2012/059186 A1 and the disclosure of which is incorporated herein by reference.

BACKGROUND OF THE INVENTION

The invention relates to a method for producing a laminate for contacting of at least one electronic component, in which an insulating layer is arranged between a first metal layer and a second metal layer, the metal layers are electrically contacted to each other in at least one contact region, a recess in the contact region or recesses in the contact regions in the insulating layer is/are generated, at least one embossing and/or at least one bulging in the contact region is generated at least in the first metal layer, wherein the distance between the two metal layers in the regions of the at least one embossing and/or bulging is reduced, and wherein the metal layers are laminated to the insulating layer.

The invention also relates to a laminate comprising a first metal layer having at least one embossing and/or at least one bulging and a second metal layer arranged essentially parallel to the first metal layer and separated from the first metal layer by an insulating layer. Lastly, the invention also relates to the use of the laminate.

Integrated circuits (ICs, chips) are contacted in most cases by a metal-coated plastic circuit board. In order to generate complex electronic circuitry, it is usually necessary to implement through-platings in the circuit substrate used. For example, printed circuit boards or punched-laminated substrates are used as circuit substrates.

Through-plating from top to bottom of a circuit board of this type is achieved by recesses in the circuit board. The recesses can take up conductive contacting parts of electronic components attached to the circuit board, which extend through the recesses and thus provide a conductive connection of the two sides. Alternatively, the recesses can comprise a patent metallic layer on their surface as through-plating.

A method for producing a metal-plastic laminate is known from German published patent application DE 198 52 832 A1, in which a metal foil is formed into a trough by embossing or deep-drawing followed by a plastic film being laminated to the formed metal foil. The metal contact surface profile remains unchanged in the process. Moreover, according to the description, a metal foil is first tacked to a plastic film, and only then is the metal foil formed into a trough by embossing or deep-drawing. In both cases, a laminate made up of a metal foil and a plastic film is produced, in which the plastic film comprises a recess in the region of the trough. Through-plating is achieved in this context by bulging the metal foil in the region of the recess of the plastic film. The actual through-plating can be generated using another conductive layer on the plastic film that is connected in conductive manner to the metal foil in the region of the trough.

This is disadvantageous in that the application of the conductive layer necessitates a second working step.

Through-plating of two metal foils that have a plastic film arranged between them is achieved by a generic method for producing a laminate for contacting an electronic component according to German published patent application DE 102 05 521 A1. In this context, two metal layers are laminated to an insulating layer either sequentially or simultaneously. A first metal layer comprises an embossing or bulging, wherein lamination of a second planar metal layer to the insulating layer provides for electrical contacting of the two metal layers.

This is disadvantageous in that an electronic component protrudes from the substrate after the conductor connectors are connected to the laminate. The elevated arrangement exposes the electronic component to mechanical stresses. Brittle chips might easily be destroyed. If the electronic component is an LED, it emits light from the surface of the laminate in all directions.

It is also disadvantageous that the electronic component subsequently needs to be connected to the laminate. This necessitates an additional working step that takes additional time in mass production and thus increases the production costs markedly. Moreover, exact positioning of the electronic component may be difficult to achieve such that a certain fraction of inexactly positioned scrap is produced with the finished product and needs to be picked out subsequently.

BRIEF SUMMARY OF THE INVENTION

It is an object of the invention to overcome disadvantages of the prior art. In particular, a more stable structure is to be achieved. The structure being flatter would be expedient for the ever advancing miniaturization of components needed, for example, in the assembly of mobile phones. Provided an LED is contacted as electronic component, an increase in luminous efficiency would also be desirable. Moreover, the electronic component to be incorporated could be integrated into a laminate while producing the through-plating.

The object of the invention is met in that the dimensions of at least one embossing and/or at least one bulging are sufficient for taking up at least one electronic component, in that at least one electronic component is inserted into at least one embossing and/or at least one bulging and is connected in conductive manner therein, such that the electronic component is taken up, entirely with respect to its circumference and at least partly with respect to the height (H) of the electronic component, in the embossing or the bulging.

A bulging shall be understood to mean that a metal layer is produced such that the shape of the bulging is predetermined without the metal layer having to be deformed or formed in order to provide the bulging. An embossing shall be understood in the present context to mean that the shape of the embossing arises by deforming a metal layer. The metal layer is planar before this process in most cases. The invention can just as well provide the metal layers to be fixed to each other in a firmly bonded manner.

Moreover, the invention can provide the distance of the two metal layers from each other to be reduced to the extent that the two metal layers touch each other.

According to the invention, the metal layers can be sintered using a silver sintering paste.

The invention can just as well provide the laminate to be laminated to the electronic component by a plastic layer, at least on the side of the electronic component.

A method according to the invention can also be characterized in that the cross-section of at least one embossing and/or at least one bulging, in particular the surface area and/or the dimensions of at least one embossing and/or at least one bulging, is/are adapted to the electronic component or electronic components, preferably to the cross-section perpendicular to height (H) of the electronic component or electronic components.

The invention can just as well provide that the cross-section of at least one embossing and/or at least one bulging, in particular its surface area and/or dimensions, are produced to be equal to or slightly larger than the dimensions, preferably the cross-section, of the electronic component or electronic components perpendicular to height (H).

An advantageous refinement of the invention provides the method to involve the use of punch-lamination for connecting the metal layers to the insulating layer and concurrently produce at least one embossing and/or at least one bulging.

The invention can just as well provide at least one embossing and/or bulging to be produced by embossing or bending the first metal layer.

It is particularly preferred to position at least one embossing and/or bulging in the first metal layer in at least one pre-existing recess in the insulating layer.

Moreover, the invention can provide the metal layers to be connected to each other in at least one contact region by welding, soldering, gluing with a conductive adhesive, or sintering.

A refinement of the invention provides at least one embossing and/or bulging to comprise at least one passage in the first metal layer or at least one passage to be produced in at least one embossing and/or bulging, wherein each passage breaks through the surface of the first metal layer.

To make up a laminate according to the invention using a method according to the invention, the invention can provide the electronic component or electronic components to be glued, soldered and/or sintered into the at least one embossing and/or at least one bulging.

It is particularly advantageous if the at least one embossing and/or at least one bulging in the first metal layer is produced in the same step, in which the electronic component is contacted to the first metal layer.

The invention can just as well provide at least one chip, at least one LED and/or at least one sensor to be used as the at least one electronic component.

In order to produce an LED illumination device from a laminate, it is advantageous according to the invention to have at least one embossing and/or at least one bulging formed such that, in particular, the angles of the side walls with respect to the first metal layer are established in such manner that light from the at least one embossing and/or at least one bulging is emitted in one direction, preferably perpendicular to the plane of the first metal layer, wherein an LED or LEDs is/are inserted as an electronic component or electronic components, respectively.

The walls of the depression then act as a kind of reflector for the light from the LED.

In this context, the invention can provide the surface of the at least one embossing and/or at least one bulging to be produced to be a reflective surface, preferably by an optically polished stamp.

Another refinement of the invention provides a plastic layer, in particular a plastic film, preferably comprising fiber-reinforced plastic material based on epoxy, PET or PI film, to be used as an insulating layer.

The invention can provide at least one of the metal layers to be made of copper, aluminum and/or a copper alloy.

A method according to the invention can also be characterized in that at least one region of the first metal layer is being separated, such that at least two regions of the first metal layer are arranged next to each other, at a distance from each other, and electrically insulated from each other, wherein at least one electronic component is connected to at least two regions in a conductive manner, preferably by at least one bonding wire, such that applying a voltage between two regions leads to an electrical current being conducted through the electronic component.

The object of the invention is also met by a laminate for contacting an electronic component, in particular produced using the method, comprising a first metal layer having at least one embossing and/or at least one bulging and a second metal layer arranged essentially parallel to the first metal layer and separated from the first metal layer by an insulating layer, wherein the metal layers form an electrically conductive contact zone at the at least one embossing and/or at least one bulging in which at least one recess is provided in the insulating layer, wherein at least one electronic component is arranged in at least one embossing and/or bulging and is taken up entirely with respect to its circumference in the at least one embossing and/or bulging, and is connected to it in conductive manner, and in that the at least one electronic component is taken up at least partly with respect to the height (H) of the electronic component, in the at least one embossing or bulging.

In this context, the invention can provide a single electronic component in one embossing and/or bulging.

Alternatively, the invention can provide the cross-section of at least one embossing and/or at least one bulging, in particular the surface area and/or the dimensions of at least one embossing and/or at least one bulging, to be adapted to the electronic component or electronic components, preferably to the cross-section perpendicular to the height (H) of the electronic component or electronic components.

Laminates according to the invention can just as well be characterized in that the cross-section of at least one embossing and/or at least one bulging, in particular the surface area and/or dimensions, are produced to be equal to or slightly larger than the dimensions, preferably the cross-section, of the electronic component or electronic components perpendicular to the height (H).

A refinement of the invention provides the metal layers to be connected to each other in at least one contact region by welding, soldering, gluing with a conductive adhesive, or sintering.

The invention can just as well provide that at least one embossing and/or bulging comprises at least one passage in the first metal layer, whereby each passage breaks through the surface of the first metal layer.

Moreover, the invention can provide the electronic component or electronic components to be glued, soldered and/or sintered into the at least one embossing and/or at least one bulging.

Particularly advantageous refinements of the invention are characterized in that at least one electronic component is a chip, an LED and/or a sensor.

Laminates that are suitable for emission are characterized in that at least one embossing and/or at least one bulging is formed such that, in particular, the angles of the side walls with respect to the first metal layer are arranged in such manner that light from the at least one embossing and/or at least one bulging is emitted in a direction, preferably perpendicular to the plane of the first metal layer, wherein the electronic component in an embossing or bulging is an LED or the electronic components in the at least one embossing and/or at least one bulging are LEDs.

The invention can provide just as well that the surface of the at least one embossing and/or at least one bulging or at least one depression is a reflecting surface.

In terms of the structure of a laminate according to the invention, the invention can provide the insulating layer to be a plastic layer, preferably a plastic film, preferably comprising fiber-reinforced plastic material based on epoxy, PET or PI film.

Moreover, the invention can provide the metal layers to comprise or consist of copper, aluminum and/or a copper alloy.

According to a particularly preferred refinement, the invention provides at least one region of the first metal layer to be separated, such that at least two regions of the first metal layer are arranged next to each other, at a distance from each other, and electrically insulated from each other, wherein at least one electronic component is connected to at least two regions in a conductive manner, preferably by at least one bonding wire, such that applying a voltage between at least two regions leads to an electrical current being conducted by the electronic component.

Lastly, the object of the invention is also met by the use of the laminate as a circuit board, sensor, LED lamp, mobile phone component, control, or regulator.

The invention is based on the surprising finding that the electronic component can be inserted into the embossing or bulging, if the embossing or bulging in the first metal layer is of sufficient size. For this purpose, not only the conductor connectors need to be taken up, but rather the entire electronic component needs to be at least partly lowerable into the embossing or bulging.

The general physical conditions required for incorporation of the electronic component can also be suitable for embossing of the first metal layer and/or formation of the through-plating of the two metal layers. This allows the incorporation of the electronic component and the production of the through-plating to be implemented in a single manufacturing step. It also allows to ensure that the electronic component is positioned at the desired site. The force required to insert or press-in the electronic component is thus simultaneously used to produce the embossing and/or for deep-drawing the first metal layer.

Moreover, the connection used to contact and connect the electronic component to the metal layers can also be used to support the entire structure. Specifically, the connection (solder, conductive adhesive, sintering compound, or welding) can be utilized to produce a heat-conducting and electrically conductive connection of the two metal layers or to directly connect the component to the second metal layer.

The measures according to the invention achieve a low design height of the laminate including the integrated electronic components, since the electronic component or electronic components is/are at least partly lowered into a corresponding embossing and/or bulging. Concurrently, there are resulting advantages in terms of heat management, since the heat generated at the electronic component can be dissipated directly by the through-plating. Shaping the embossings and/or bulgings appropriately allows their walls to be utilized for reflection of radiation to be measured onto a sensor as the electronic component or for reflection of emitted radiation of an emitter, such as an LED as the electronic component.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
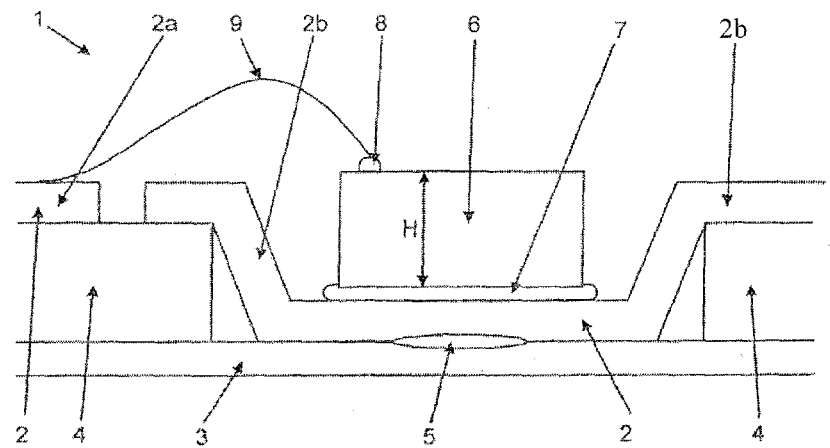
FIG. 1 shows a schematic cross-sectional view of a laminate according to an embodiment of the invention.

FIG. 1 shows a schematic cross-sectional view of a laminate 1 according to an embodiment of the invention or, as the case may be, a schematic cross-sectional view of a laminate 1 produced using a method according to an embodiment of the invention. Laminate 1 comprises a first metal layer 2, a second metal layer 3, and a plastic film 4 as an insulating layer between the two metal layers 2, 3. The metal layers 2, 3 are applied to the plastic film 4 by lamination technology. The first metal layer is subdivided into two regions 2a and 2b that are situated at a distance from each other and are electrically insulated from each other.

An embossing produced by embossing, deep-drawing or any other forming technique in a previously planar first metal layer 2 is provided in the second region 2b of the first metal layer 2. The distance between the first region 2a and the second region 2b can also arise by the forming or can be punched out. Alternatively, a bulging may be provided that is produced during production of the first metal layer 2. Accordingly, a bulging can be produced alternatively by conferring a corresponding shape to the first metal layer 2 right away. For this purpose, the first metal layer 2 can be applied, for example, onto a corresponding mold or directly to the plastic film 4, for example by vapor deposition or casting.

A recess is provided in the plastic film 4 in the region of the embossing or bulging. The recess can either be provided beforehand or can be produced during the forming and/or punching of the first metal layer 2. Preferably, producing the laminate 1, in particular connecting the metal layers 2, 3 to the plastic film 4, is implemented during the formation of the embossing or bulging in a single step. According to the invention, the application of a punch-lamination technology is particularly well-suited for this purpose.

The two metal layers 2, 3 are subjected to welding in the region of the embossing or bulging. A laser beam welding technique, for example, is well-suited for this purpose. However, any other connecting techniques can be used as well to produce a conductive connection, for example soldering, gluing with a conductive adhesive, or sintering with a conductive sintering compound (for example a silver sintering compound). The two metal layers 2, 3 are therefore connected to each other in conductive manner by conductive first connection 5.

The embossing or bulging has an electronic component 6 inserted into it, which is connected in a conductive manner on its floor-side by second connection 7 to the first metal layer 2 in its region 2b. As before, solders, conductive adhesives, and conductive sintering compounds are suitable conceivable second connection 7. The electronic component 6 can be a chip, an LED, an integrated circuit or a sensor. Conceivable sensors are, for example, photodiodes, phototransistors or stress-strain sensors. Due to the depression formed jointly by the embossing or bulging and the recess, the electronic component 6 is situated in laminate 1 such as to be protected. However, the height H of the electronic component 6 is slightly larger than the depth of the embossing or bulging. Accordingly, the electronic component 6 protrudes slightly.

Aside from the floor-side contacting by second connection 7, the electronic component 6 is also connected on its top to a contacting 8 and a bonding wire 9. The bonding wire 9 connects the top of the electronic component 6 to the first region 2a of the first metal layer 2. The structure of the electronic component 6 is such that it has contacts for supplying voltage to the electronic component 6 situated on its top and underside. Applying a voltage between the first region 2a and the second region 2b of the first metal layer 2, the current can flow through the electronic component 6. This operates the electronic component 6.

The embossing or bulging can be made in the first metal layer 2 while the electronic component 6 is being inserted and connected.

Figure 2:
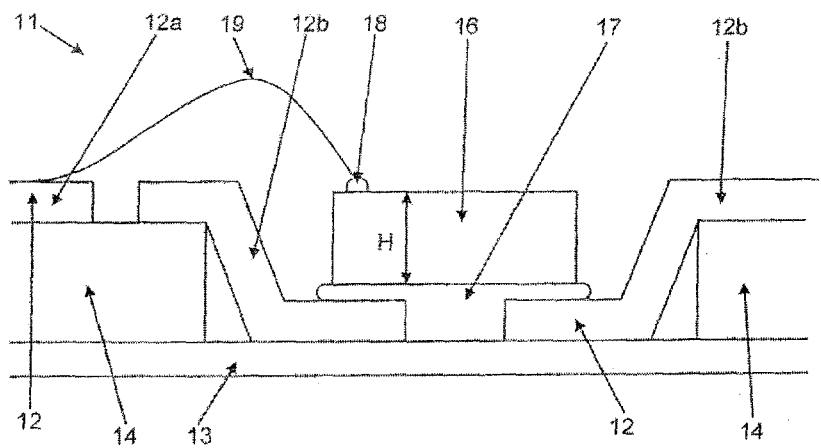
FIG. 2 shows a cross-sectional view of a second laminate according to another embodiment of the invention.

FIG. 2 shows a schematic cross-sectional view of a laminate 11 according to a second embodiment of the invention or, as the case may be, of another laminate 11 built-up using a method according to another embodiment of the invention. The structure of laminate 11 resembles that of laminate 1 illustrated based on FIG. 1. As before, a first metal layer 12 and a second metal layer 13 are separated from each other by an insulating layer 14. The insulating layer 14 can be made, for example, of plastic material, for example PET, glass or a glass fiber-epoxy compound material. The first metal layer 12 is subdivided into two regions 12a and 12b that are insulated from each other. A passage is arranged in the second region 12b of the first metal layer 12 and breaks through the surface of the first metal layer 12.

An electronic component 16 is arranged above the breakthrough and is connected on its floor-side in conductive manner both to the second region 12b of the first metal layer 12 and to the second metal layer 13 by connection 17, which fills the break-through. On its top, the electronic component 16 is connected by a contacting 18 to a bonding wire 19 connecting the electronic component 16 to the first region 12a of the first metal layer 12.

Figure 3:
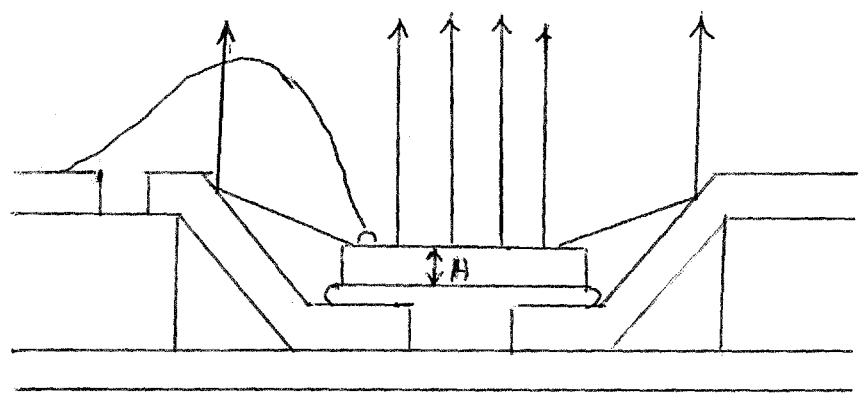
FIG. 3 is a cross-sectional view of a laminate similar to FIG. 2, illustrating schematically the light emitted from an LED and reflected from the embossing or bulging in a direction perpendicular to a major plane of the first metal layer.

Provided the electronic component 6, 16 is an LED, the walls of the embossing or bulging formed by the first metal layer 2, 12 act as reflectors for the light emitted by the LED. Producing the embossing or bulging with a suitable tool allows the reflection properties of the embossing or bulging to be influenced specifically and thus allows them to be optimized. For example, the angles of the side walls of the embossing or bulging can be established suitably such that the light emitted by the LED is directed in a certain direction, for example perpendicular to the first metal layer 2, 12, as illustrated schematically by the arrows in FIG. 3. The same principle can be applied in reverse as well provided the electronic component 6, 16 is a light sensor or a photosensor. The light or the electromagnetic radiation, as the case may be, is then reflected onto the sensor by the walls of the embossing or bulging. If an embossing stamp is used for embossing and the stamp is polished to be of optical quality, the stamp can produce a particularly smooth surface of the embossing such that undesired scattering of the incident or emergent light is minimized.

The laminates 1, 11 having an integrated electronic component 6, 16, explained based on the two figures, can easily be extended to laminates 1, 11 having multiple embossings and/or bulgings, for example by arranging any number of the structures shown in the figures next to each other or in sequence (relative to the image plane of FIGS. 1 and 2). In this case, equal or different electronic components 6, 16 are arranged in the different embossings and/or bulgings. The different regions 2a, 2b, 12a, 12b of the first metal layers 2, 12 can be contacted to each other or are separated from each other by different means. Accordingly, the electronic components 6, 16 can be circuited in series or parallel.

For improved dissipation of heat, the second metal layer 3, 13 situated underneath can be designed to be thicker. Likewise, active cooling of the second metal layer 3, 13, for example by Peltier elements, air cooling or liquid cooling, is conceivable just as well.

The features of the invention disclosed in the preceding description and in the claims, figures, and exemplary embodiments, can be essential for the implementation of the various embodiments of the invention both alone and in any combination.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a laminate for contacting at least one electronic component, the method comprising:
    arranging an insulating layer between a first metal layer and a second metal layer,
    electrically contacting the metal layers to each other in at least one contact region,
    generating at least one recess in the at least one contact region in the insulating layer,
    generating at least one embossing or bulging in the at least one contact region at least in the first metal layer, wherein a distance between the metal layers in regions of the at least one embossing or bulging is reduced, and
    laminating the metal layers to the insulating layer,
    wherein dimensions of the at least one embossing or bulging are sufficient for taking up at least one electronic component,
    wherein at least one light emitting diode (LED) is inserted as the electronic component, and the at least one electronic component is inserted into the at least one embossing or bulging and is connected in conductive manner therein, such that the electronic component is taken up in the at least one embossing or bulging entirely with respect to a circumference of the electronic component and with respect to a height of the electronic component,
    wherein the embossing or bulging is formed such that an angle of a side wall with respect to the first metal layer is established,
    a surface of the at least one embossing or bulging is a reflective surface, produced by a stamp which is polished to be of optical quality, wherein the stamp produces a smooth surface of the embossing or bulging, and
    wherein the first metal layer and the second metal layer at least partially touch each other.

2. The method according to claim 1, wherein a cross-section of the at least one embossing or bulging is produced to be equal to or larger than dimensions of the at least one electronic component.

3. The method according to claim 2, wherein the cross-section of the at least one embossing or bulging is produced to be at least equal to a cross-section of the at least one electronic component perpendicular to the height.

4. The method according to claim 1, wherein the metal layers are connected to the insulating layer by punch-lamination which concurrently produces the at least one embossing or bulging.

5. The method according to claim 1, wherein the at least one embossing or bulging in the first metal layer is positioned in at least one pre-existing recess in the insulating layer.

6. The method according to claim 1, wherein the at least one embossing or bulging comprises at least one passage in the first metal layer or at least one passage is produced in the at least one embossing or bulging, wherein each passage breaks through a surface of the first metal layer.

7. The method according to claim 1, wherein the at least one embossing or bulging in the first metal layer is produced in a same step in which the electronic component is contacted to the first metal layer.

8. The method according to claim 1, wherein the light from the at least one embossing or bulging is emitted in a direction perpendicular to a major plane of the first metal layer.

9. The method according to claim 1, wherein at least one region of the first metal layer is separated such that at least two regions of the first metal layer are arranged next to each other spaced from each other and electrically insulated from each other, and wherein the at least one electronic component is connected to at least two regions in a conductive manner.

10. The method according to claim 9, wherein the at least one electronic component is connected to the at least two regions by at least one bonding wire such that applying a voltage between the two regions leads to an electrical current being conducted through the electronic component.

* * * * *